United States Patent
Kim et al.

(10) Patent No.: US 10,714,660 B2
(45) Date of Patent: Jul. 14, 2020

(54) LIGHT-EMITTING DEVICE PACKAGE HAVING A DEVICE TO PREVENT PERMEATION OF FOREIGN SUBSTANCES

(71) Applicant: LG INNOTEK CO., LTD., Seoul (KR)

(72) Inventors: Byung Mok Kim, Seoul (KR); Ha Na Kim, Seoul (KR); Hiroshi Kodaira, Seoul (KR); Baek Jun Kim, Seoul (KR); Jung Woo Lee, Seoul (KR); Sang Ung Hwang, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 15/319,318

(22) PCT Filed: May 27, 2015

(86) PCT No.: PCT/KR2015/005272
§ 371 (c)(1),
(2) Date: Dec. 15, 2016

(87) PCT Pub. No.: WO2015/194766
PCT Pub. Date: Dec. 23, 2015

(65) Prior Publication Data
US 2017/0117443 A1   Apr. 27, 2017

(30) Foreign Application Priority Data
Jun. 16, 2014 (KR) .................. 10-2014-0072693

(51) Int. Cl.
*H01L 33/00* (2010.01)
*H01L 33/48* (2010.01)
(Continued)

(52) U.S. Cl.
CPC .......... *H01L 33/483* (2013.01); *H01L 33/486* (2013.01); *H01L 33/52* (2013.01);
(Continued)

(58) Field of Classification Search
CPC ..... H01L 33/483; H01L 33/58; H01L 33/486; H01L 33/52; H01L 2224/48091; H01L 2924/181
(Continued)

(56) References Cited

U.S. PATENT DOCUMENTS 5,066,965 A * 11/1991 Tanaka .................. G03B 17/08
396/29
8,829,632 B2 * 9/2014 Fuse ................. H01L 27/14618
257/432

(Continued)

FOREIGN PATENT DOCUMENTS

CN   102956794   3/2013
EP   2 287 640    2/2011
(Continued)

OTHER PUBLICATIONS

International Search Report (with English translation) and Written Opinion dated Aug. 13, 2015 issued in Application No. PCT/KR/2015/005272.
(Continued)

*Primary Examiner* — Mohammad M Hoque
(74) *Attorney, Agent, or Firm* — KED & Associates LLP

(57) ABSTRACT

A light-emitting device package according to an embodiment includes a package body including a cavity and a recessed portion formed around the cavity, the recessed portion having at least one concave portion; at least one light-emitting device mounted in the cavity; a light-transmitting member disposed to cover a top of the cavity and configured to transmit light emitted from the at least one light-emitting device; and a bonding member accommodated in the at least one concave portion so as to allow the light-transmitting member and the package body to be bonded to each other in the recessed portion.

13 Claims, 10 Drawing Sheets

(51) Int. Cl.
*H01L 33/52* (2010.01)
*H01L 33/58* (2010.01)

(52) U.S. Cl.
CPC .... *H01L 33/58* (2013.01); *H01L 2224/48091* (2013.01); *H01L 2924/181* (2013.01)

(58) Field of Classification Search
USPC .......................................................... 257/98
See application file for complete search history.

(56) References Cited

U.S. PATENT DOCUMENTS

| | | | | |
|---|---|---|---|---|
| 9,799,802 | B2* | 10/2017 | Kim | H01L 33/486 |
| 2005/0218421 | A1* | 10/2005 | Andrews | H01L 33/58 |
| | | | | 257/100 |
| 2007/0090382 | A1* | 4/2007 | Ryu | H01L 33/486 |
| | | | | 257/98 |
| 2007/0099325 | A1* | 5/2007 | Park | H01L 33/486 |
| | | | | 438/33 |
| 2008/0099139 | A1* | 5/2008 | Miyoshi | H01L 23/296 |
| | | | | 156/291 |
| 2008/0232106 | A1* | 9/2008 | Brune | F21V 5/04 |
| | | | | 362/267 |
| 2009/0065793 | A1 | 3/2009 | Hon et al. | |
| 2010/0309660 | A1* | 12/2010 | Lim | F21S 48/328 |
| | | | | 362/231 |
| 2011/0089449 | A1* | 4/2011 | Chou | H01L 33/486 |
| | | | | 257/98 |
| 2011/0241028 | A1* | 10/2011 | Park | H01L 33/486 |
| | | | | 257/88 |
| 2012/0037936 | A1* | 2/2012 | Lu | H01L 33/58 |
| | | | | 257/98 |
| 2012/0320621 | A1* | 12/2012 | Kleo | B32B 17/10018 |
| | | | | 362/558 |
| 2013/0234274 | A1* | 9/2013 | Kam | H01L 33/58 |
| | | | | 257/432 |
| 2014/0367718 | A1* | 12/2014 | Park | H01L 33/486 |
| | | | | 257/98 |
| 2014/0374777 | A1* | 12/2014 | Tanuma | H01L 33/60 |
| | | | | 257/82 |
| 2016/0005931 | A1* | 1/2016 | Lee | H01L 33/486 |
| | | | | 257/98 |

FOREIGN PATENT DOCUMENTS

| | | | |
|---|---|---|---|
| JP | 2007-234637 | | 9/2007 |
| JP | 2007234637 A | * | 9/2007 |
| JP | 2007-317816 | | 12/2007 |
| JP | 2007317815 A | * | 12/2007 |
| KR | 10-2012-0118692 | | 10/2012 |
| KR | 10-2013-0047169 | | 5/2013 |
| KR | 10-2013-0101846 | | 9/2013 |

OTHER PUBLICATIONS

Chinese Office Action dated May 29, 2018 issued in Application No. 2015800326526 (English translation attached).
Chinese Office Action dated Apr. 18, 2019 issued in Application 201580032652.6.

* cited by examiner

RELATED ART

[Fig. 1]

LIGHT-EMITTING DEVICE PACKAGE HAVING A DEVICE TO PREVENT PERMEATION OF FOREIGN SUBSTANCES

CROSS-REFERENCE TO RELATED PATENT APPLICATIONS

This application is a U.S. National Stage Application under 35 U.S.C. § 371 of PCT Application No. PCT/KR2015/005272, filed May 27, 2015, which claims priority to Korean Patent Application No. 10-2014-0072693, filed Jun. 16, 2014, whose entire disclosures are hereby incorporated by reference.

TECHNICAL FIELD

Embodiments relate to a light-emitting device package.

BACKGROUND ART

Red, green and blue Light Emitting Diodes (LEDs), which may realize very bright white light, have been developed based on the development of, for example, a gallium nitride (GaN) metal organic chemical vapor deposition method and a molecular beam growth method.

These LEDs substitute for conventional light sources because they include no environmentally noxious materials, such as mercury (Hg), which are used in conventional lighting appliances, such as, for example, incandescent lamps and fluorescent lamps, thus being very environmentally friendly, and also have several advantages, such as, for example, a long lifespan and low power consumption. The salient competitiveness of the LEDs is to realize high brightness through high-efficiency and high-output chip and packaging technologies.

FIG. 1 is a schematic sectional view of a conventional light-emitting device package, which includes a package body 10 having a cavity C, an LED 20, a glass 30, and an adhesive 40.

Considering the process of manufacturing the conventional light-emitting device package illustrated in FIG. 1, after the adhesive 40 is deposited on the upper surface of the package body 10 close to the cavity C, the glass 30 is pushed by a force of about 400 gf so as to be bonded to the package body 10. At this time, as the adhesive 40 is introduced into the cavity C by the force pushing the glass 30, as illustrated in FIG. 1, the function of reflecting light at the slope of the cavity C may be prevented by the adhesive 40 that has been introduced into the cavity C.

In addition, in the case where the LED 20 emits light in a wavelength band of deep ultraviolet light, when the adhesive 40 introduced into the cavity C is exposed to deep ultraviolet light for a long time to thereby be discolored, a great quantity of light is absorbed by the introduced adhesive 40, which may cause deterioration in light emission efficiency. In particular, in the case where the adhesive 40 is formed of silicon or epoxy, the adhesive 40 is discolored and thereafter decomposed, which may break the bond between the glass 30 and the package body 10, and may reduce the lifespan of the light-emitting device package due to, for example, the entry of moisture through, for example, micro cracks formed in the light-emitting device package.

In addition, the adhesive 40 may also serve to prevent external moisture or water from being introduced into the cavity C. However, when an external foreign substance 50 is in a gaseous state, for example, when gas molecules including water molecules permeate from the outside, the adhesive 40 may have difficulty in completely blocking them. In particular, when the light-emitting device package is operated for a long time in a high-temperature and high-humidity environment, for example, moisture or water may enter the cavity C, thereby causing discoloration of, for example, a plated portion of the light-emitting device package and an electrode portion of the LED 20, which may further deteriorate the lifespan and performance of the light-emitting device package.

DISCLOSURE

Technical Problem

Embodiments provide a light-emitting device package having enhanced light emission efficiency, an extended lifespan, and waterproofing, vapor resistance, and dustproofing functions.

Technical Solution

An embodiment provides a light-emitting device package including a package body including a cavity and a recessed portion formed around the cavity, the recessed portion having at least one concave portion, at least one light-emitting device mounted in the cavity, a light-transmitting member disposed to cover a top of the cavity and configured to transmit light emitted from the at least one light-emitting device, and a bonding member accommodated in the at least one concave portion so as to allow the light-transmitting member and the package body to be bonded to each other in the recessed portion. The concave portion may have a spatial volume that is equal to or greater than a volume of the bonding member.

The at least one concave portion may have a ring plan shape, or a dot plan shape.

The at least one concave portion may include a plurality of concave portions spaced apart from one another by a predetermined distance in a direction that is perpendicular to a thickness direction of the package body.

The separation distance between the concave portions may be equal to or less than a half a length of each of the concave portions.

The at least one concave portion may be spaced apart from the cavity by a first distance.

The light-transmitting member may be spaced apart from an upper surface of the package body by a second distance in a thickness direction of the package body in the recessed portion, and the second distance may be equal to or greater than zero and may be less than a depth of the at least one concave portion.

At least one of the cavity or the at least one concave portion may have a circular, elliptical, or polygonal plan shape.

The bonding member may be located to seal a space between the package body and the light-transmitting member.

The at least one light-emitting device may emit light in a wavelength band of ultraviolet light.

The bonding member may include an UV bond, acryl, urethane, silicon, or epoxy.

The at least one light-emitting device may include a sub mount, and a light-emitting diode flip-bonded on the sub mount.

The light-transmitting member may include a flat sheet, a semispherical lens, or a spherical lens.

The light-emitting device package may further include a molding member located in the cavity so as to enclose the at least one light-emitting device. Alternatively, the cavity may be in a vacuum state.

The light-emitting device package may further include a rubber ring located between a side surface of the light-transmitting member and the package body.

The rubber ring may be located on the bonding member in a space between the light-transmitting member and the package body.

The rubber ring may have a circular, elliptical, or polygonal plan shape. The rubber ring may have a width ranging from 0.1 mm to 0.15 mm.

Advantageous Effects

A light-emitting device package according to an embodiment may have enhanced luminous efficacy and an extended lifespan, may increase bonding force as a bonding member bonds a package body and a light-transmitting member to each other over more increased area, and may have excellent waterproofing, vapor resistance, and dustproofing functions because it may prevent, for example, external moisture, water or dust from being introduced into a cavity.

BEST MODE

Figure 1:
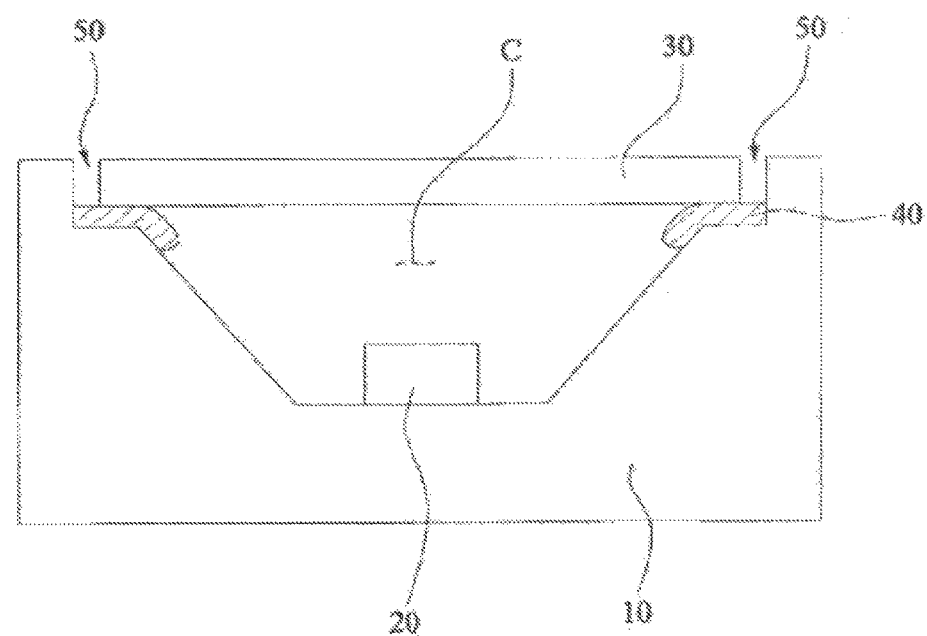
FIG. 1 is a schematic sectional view of a conventional light-emitting device package.

Hereinafter, embodiments will be described in detail with reference to the accompanying drawings, in order to concretely describe the disclosure and to assist the understanding of the disclosure. However, the embodiments disclosed here may be altered in various other forms, and the scope of the disclosure should not be construed as limited to the embodiments. The embodiments disclosed here are provided in order to more perfectly describe the disclosure to those of ordinary skill in the art.

In the description of the embodiments disclosed here, it will be understood that, when an element is referred to as being formed "on" or "under" another element, it can be directly "on" or "under" the other element or be indirectly formed with intervening one or more elements therebetween. It will also be understood that "on" or "under" the element may be described relative to the drawings.

In the drawings, the thickness or size of each layer may be exaggerated, omitted or schematically illustrated for clarity and convenience. In addition, the size of each constituent element does not wholly reflect an actual size thereof.

In addition, relative terms such as, for example, "first", "second", "on/upper/above" and "beneath/lower/below", used in the following description may be used to distinguish any one substance or element with another substance or element without requiring or containing any physical or logical relationship or sequence between these substances or elements.

Figure 2:
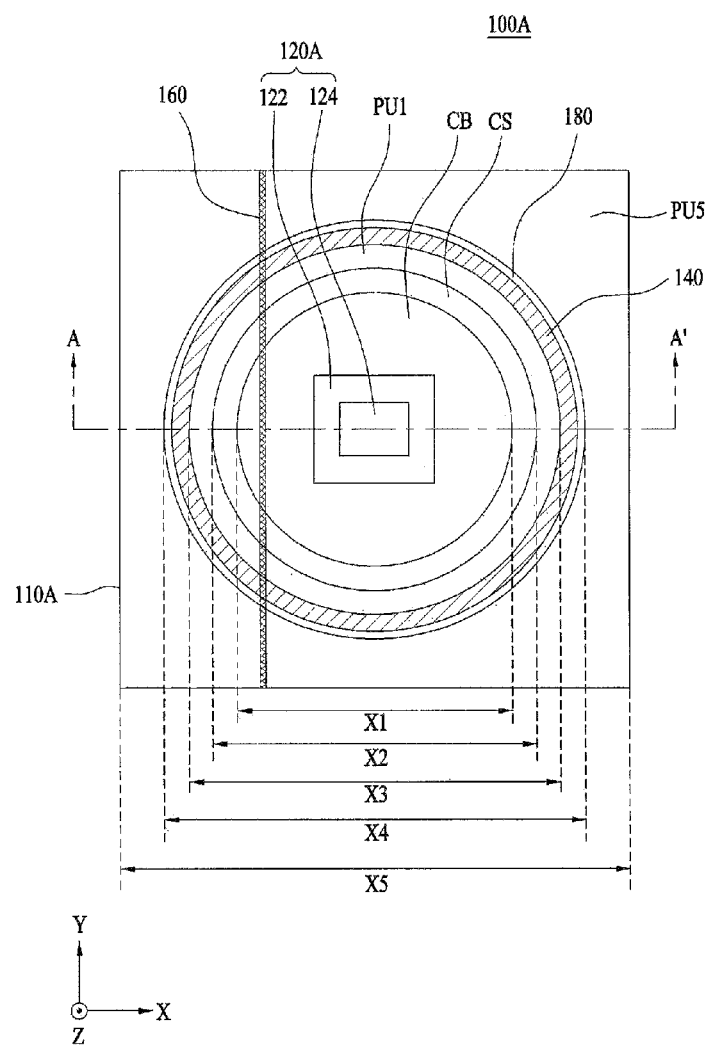
FIG. 2 is a plan view of a light-emitting device package according to an embodiment.
Figure 3:
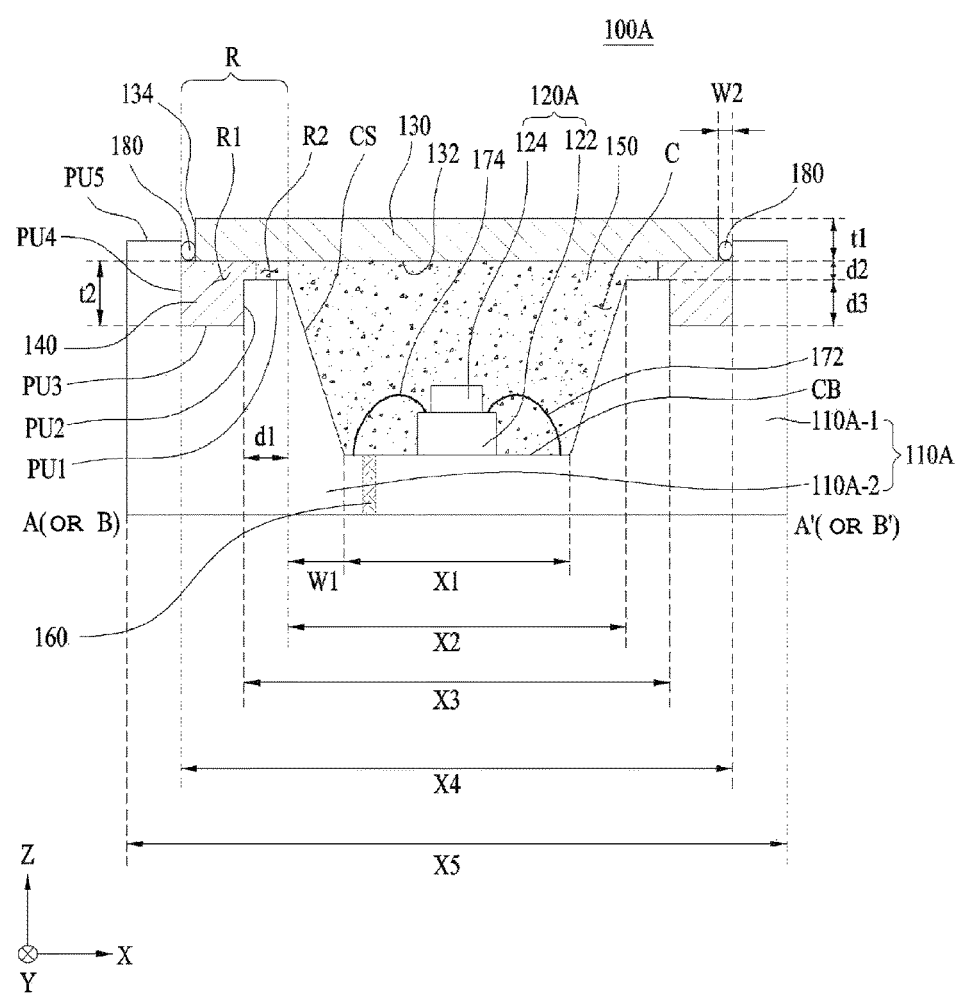
FIG. 3 is a sectional view taken along line A-A' of FIG. 2.

FIG. 2 is a plan view of a light-emitting device package 100A according to an embodiment, and FIG. 3 is a sectional view taken along line A-A' of FIG. 2. In order to assist the understanding of the embodiment, in FIG. 2, a light-transmitting member 130 and a molding member 150 illustrated in FIG. 3 are omitted.

Referring to FIGS. 2 and 3, the light-emitting device package 100A may include a package body 100A, a light-emitting device 120A, a light-transmitting member 130, a bonding member 140, a molding member 150, an insulator 160, and first and second wires 172 and 174.

The package body 110A includes a cavity C and a recessed portion R.

The cavity C is formed in the package body 110A, has a bottom surface CB and a side surface CS, and is defined by a space that is enclosed by the bottom surface CB and the side surface CS. In addition, as illustrated in FIGS. 2 and 3, although the cavity C may be formed in the center of the package body 110A in the direction (the X-axis direction) that is perpendicular to the thickness direction (the Z-axis direction) of the package body 110A, the embodiment is not limited as to the position of the cavity C.

At this time, a reflective layer (not illustrated) may be coated or disposed on the side surface CS of the cavity C. As such, light emitted from the light-emitting device 120A may be reflected by the reflective layer disposed on the side surface CS of the cavity C to thereby be directed to the light-transmitting member 130. In addition, the first width W1 of the side surface CS of the cavity C may be "zero" or more.

The recessed portion R is formed around the cavity C. More specifically, the recessed portion R is defined by the space that is enclosed by a first upper surface PU1, a first side surface PU2, a second upper surface PU3, a second side surface PU4, and a lower surface 132 of the light-transmitting member 130. Here, the first upper surface PU1 corresponds to the upper surface of the package body 110A that is adjacent to the side surface CS of the cavity C. The first side surface PU2 corresponds to the side surface of the upper portion of the package body 110A that extends from the first upper surface PU1 in the thickness direction (the Z-axis direction) of the package body 110A. The second upper surface PU3 corresponds to the upper surface of the package body 110A that extends from the first side surface PU2 in the direction (the X-axis direction) that is perpendicular to the thickness direction (the Z-axis direction) of the package body 110A. The second side surface PU4 corresponds to the side surface of the upper portion of the package body 110A that extends from the second upper surface PU3 in the thickness direction (the Z-axis direction) of the package body 110A.

In addition, the recessed portion R may include first and second recessed portions R1 and R2.

The first recessed portion (or a concave portion) R1 is defined by the space that is enclosed by the first side surface PU2, the second upper surface PU3, the second side surface PU4, and the lower surface 132 of the light-transmitting member 130. The first recessed portion R1 may have a ring plan shape, and may be spaced apart from the cavity C by a first distance d1.

The second recessed portion R2 is defined by the space in the recessed portion R excluding the first recessed portion R1.

Although at least one of the cavity C, the first or second recessed portion R1 or R2 may have a circular plan shape as illustrated in FIG. 2, the embodiment is not limited thereto. That is, according to another embodiment, at least one of the cavity C, the first or second recessed portion R1 or R2 may have an elliptical or polygonal plan shape, for example, a square plan shape unlike the illustration of FIG. 2.

In addition, referring to FIGS. 2 and 3, the width of the bottom surface CB of the cavity C in the package body 110A may be "X1", the width including the bottom surface CB and the side surface CS of the cavity C may be "X2", the width including the first upper surface PU1 and the cavity may be "X3", the width including the cavity C and the first and second upper surfaces PU1 and PU3 may be "X4", and the width of the entire package body 110A may be "X5".

Meanwhile, at least one light-emitting device 120A is mounted on the bottom surface CB of the cavity C. In the case of FIGS. 2 and 3, although only one light-emitting device 120A is illustrated, the embodiment is not limited as to the number of light-emitting devices 120A.

Although the at least one light-emitting device 120A may emit light in a wavelength band of visible light or ultraviolet light, the embodiment is not limited as to the wavelength band of the light to be emitted. For example, the wavelength band of the light emitted from the at least one light-emitting device 120A may be the wavelength band of ultraviolet light within a range from 200 nm to 405 nm, or may be the wavelength band of deep ultraviolet light within a range from 200 nm to 300 nm.

In addition, although the at least one light-emitting device 120A may include a sub mount 122 and a light-emitting diode 124, the embodiment is not limited to this structure of the light-emitting device 120A.

The sub mount 122 may be a semiconductor substrate formed of, for example, AlN, BN, silicon carbide (SiC), GaN, GaAs, or Si without limitation thereto, and may be formed of a semiconductor material having excellent thermal conductivity. In addition, a device in the form of a Zener diode for the prevention of Electro Static Discharge (ESD) may be included in the sub mount 122.

Although the light-emitting diode 124 may be flip-bonded on the sub mount 122, the embodiment is not limited as to the manner of bonding the light-emitting device 120A. That is, according to another embodiment, the light-emitting device 120A may have a vertical bonding structure or a horizontal bonding structure. In this case, the sub-mount 122 is omitted.

The light-emitting diode 124 may be a side-view-type light-emitting diode or a top-view-type light-emitting diode.

In addition, the light-emitting diode 124 may be configured as a blue LED or ultraviolet LED, or may be configured in the form of a package including at least one selected from among a red LED, a green LED, a blue LED, a yellow green LED, and a white LED, or combinations of two or more thereof.

The above-described package body 110A may include first and second body portions 110A-1 and 110A-2, and may be formed of a metal having excellent electrical conductivity and heat radiation. For example, the package body 110A may be formed of aluminum. Because the package body 110A is formed of a metal, in order to electrically insulate the first and second body portions 110A-1 and 110A-2 from each other, the insulator 160 may be located between the first and second body portions 110A-1 and 110A-2.

In addition, referring to FIG. 3, although the sub mount 122 is illustrated as being disposed on the first body portion 110A-1, the embodiment is not limited thereto. That is, the sub mount 122 may be disposed on the second body portion 110A-2, rather than the first body portion 110A-1.

First and second electrodes (not illustrated) of the light-emitting device 120A are respectively connected to the first and second body portions 110A-1 and 110A-2 by first and second wires 172 and 174.

Meanwhile, the light-transmitting member 130 may cover the top of the cavity C, and may transmit light emitted from the at least one light-emitting device 120A in the vertical direction (in the Z-axis direction). To this end, the light-transmitting member 130 may be formed of a transparent material to enable the transmission of the light emitted from the light-emitting device 120A. For example, although the light-transmitting member 130 may be formed of, for example, quartz or sapphire, the embodiment is not limited as to the constituent material of the light-transmitting member 130.

In addition, although the light-transmitting member 130 may have a flat plate shape, as illustrated in FIG. 3, the embodiment is not limited thereto. That is, according to another embodiment, the light-transmitting member 130 may have a semispherical or spherical shape. In addition, the light-transmitting member 130 may include a flat sheet, a semispherical lens, or a spherical lens.

In addition, although the light-transmitting member 130 may have a first thickness t1 within a range from several μm to tens of μm, the embodiment is not limited thereto.

In addition, in the recessed portion R, a second distance d2 by which the light-transmitting member 130 is spaced apart from the first upper surface PU1 of the package body 110A in the thickness direction (the Z-axis direction) of the package body 110A may be "zero" or more. When the second distance d2 is "zero", the lower surface 132 of the light-transmitting member 130 comes into contact with the first upper surface PU1 of the package body 110A. Thereby, the tip end of the side surface CS of the cavity C may come into contact with the lower surface 132 of the light-transmitting member 130. Accordingly, the light emitted from the light-emitting device 120A may be reflected by the side surface CS of the cavity C and then pass through the light-transmitting member 130A to thereby be emitted upward (in the Z-axis direction).

When the second distance d2 is greater than the depth d3 of the first recessed portion (or the concave portion) R1, because the space in the concave portion R1 in which the bonding member 140 may be accommodated is narrow, the bonding member 140 may be introduced to the space in the cavity C when the light-transmitting member 130 is compressed in the Z-axis direction so as to be coupled to the package body 110A.

Accordingly, although the second distance d2 may be "zero" or more and may be less than the depth d3, the embodiment is not limited as to the second distance d2.

Meanwhile, the bonding member 140 may be located in the recessed portion R so as to bond the light-transmitting member 130 to the package body 110A, and may be accommodated in at least one concave portion R1. At this time, as illustrated in FIG. 3, when the light-transmitting member 130 is compressed by, for example, a force of 400 gf in the thickness direction (the Z-axis direction) of the package body 110A, a portion of the bonding member 140 may run over the recessed portion R1 to a portion of the first upper surface PU1 of the package body 110A after a portion of bonding member 140 is completely accommodated in the concave portion R1. Therefore, the first distance d1 may be determined with considering that the bonding member 140 runs over to the first upper surface PU1. Accordingly, it will be appreciated that the first distance d1 is set to be greater than "zero". That is, the bonding member 140 may occupy a portion of the second recessed portion R2 while being accommodated in the first recessed portion R1.

When the bonding member 140 is not entirely accommodated in the first recessed portion R1, but moves to the inside of the cavity C by way of the first upper surface PU1 of the package body 110A, the side surface CS of the cavity C may be contaminated, thus causing deterioration in the reflective function of a reflective layer. In this case, when the light-emitting device 120A emits, in particular, light in a wavelength band of deep ultraviolet light, the bonding member 140, which moves to the side surface CS of the cavity C, may be discolored, thus causing an unpleasant appearance and decomposition. In order to prevent this, not only the first distance d1 may be determined but also the volume of the first recessed portion R may be equal to or greater than the volume of the bonding member 140.

The bonding member 140 may have a second thickness t2, which is determined in consideration of, for example, processing tolerance in the process of forming the recessed portion R in the top of the package body 110A or the minimum amount of the bonding member 140 that is required in order to bond the light-transmitting member 130 to the top of the package body 110A.

In addition, when the bonding member 140 is not entirely accommodated in the first recessed portion R1, but runs over the first recessed portion R1 to the second recessed portion R2, the contact area of the bonding member 140, the package body 110A and the light-transmitting member 130 may be increased, resulting in increased bonding force.

In addition, the bonding member 140 may be formed of an organic material. In particular, when the light-emitting device 120A emits light in a wavelength band of deep ultraviolet light, the bonding member 140 may be configured as, for example, a UV bond, but the embodiment is not limited thereto. However, when the light-emitting device 120A emits light in a wavelength band of visible light, the bonding member 140 may be formed of any of various materials, such as acryl, urethane, silicon, or epoxy.

In addition, when the bonding member 140 is located to seal the empty space between the package body 110A and the light-transmitting member 130, the entry of external moisture, water or dust into the cavity C may be prevented.

In addition, referring to FIG. 3, the light-emitting device package 100A may further include the molding member 150. The molding member 150 is located in the cavity C so as to enclose the at least one light-emitting device 120A. In addition, the molding member 150 may include a phosphor in order to change the wavelength of the light emitted from the light-emitting device 120A. For example, when the light-emitting device 120A emits blue light and the molding member 150 includes a yellow phosphor, white light may be emitted to the top of the light-transmitting member 130. Alternatively, when the light-emitting device 120A emits blue light and the molding member 150 includes a red phosphor and a green phosphor, white light may be emitted to the top of the light-transmitting member 130. Alternatively, when the light-emitting device 120A emits blue light and the molding member 150 includes a yellow phosphor, a red phosphor and a green phosphor, white light may be emitted to the top of the light-transmitting member 130.

Figure 4:
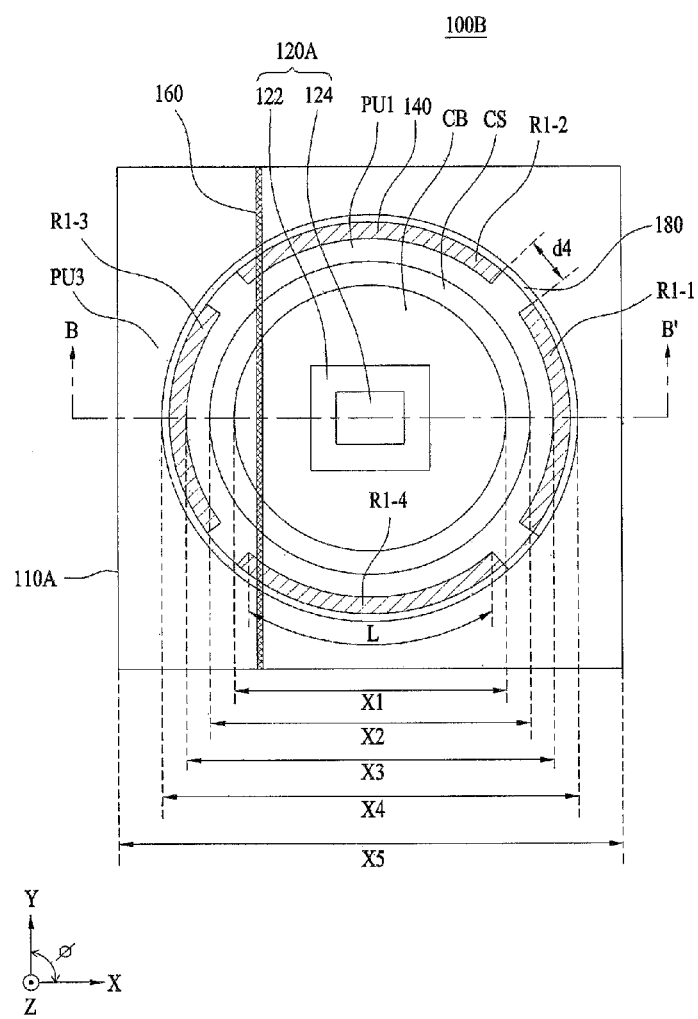
FIG. 4 is a plan view of a light-emitting device package according to another embodiment.

FIG. 4 is a plan view of a light-emitting device package 100B according to another embodiment.

The cross-sectional view taken along line B-B' of FIG. 4 is the same as the cross-sectional view of FIG. 3. In the light-emitting device package 100A illustrated in FIG. 2, the first recessed portion R1 has a closed-ring plan shape. On the other hand, referring to FIG. 4, the first recessed portion R1 may include a plurality of first recessed portions R1-1, R1-2, R1-3 and R1-4. The first recessed portions R1-1, R1-2, R1-3 and R1-4 may be spaced apart from each other by a fourth distance d4 in the direction (the Φ-axis direction) perpendicular to the thickness direction (the Z-axis direction) of the package body 110A.

Here, the respective first recessed portions R1-1, R1-2, R1-3 and R1-4 may be the same length L, or may be different lengths L. In addition, the separation distance d4 between the first recessed portions R1-1, R1-2, R1-3 and R1-4 may be the same, or may be different. For example, the separation distance d4 between the first-first recessed portion R1-1 and the first-second recessed portion R1-2 may be different from the separation distance d4 between the first-second recessed portion R1-2 and the first-third recessed portion R1-3.

When the fourth distance d4 between the first recessed portions R1-1, R1-2, R1-3 and R1-4 is greater than a half the length L, the space occupied by the first recessed portion R1 in which the bonding member 140 is accommodated may be narrow, and thus the bonding member 140 may run over the first recessed portion R1 to thereby move into the cavity C. In order to prevent this, although the fourth distance d4 may be equal to or less than half the length of the respective first recessed portions R1-1, R1-2, R1-3 and R1-4, the embodiment is not limited thereto.

With the exception of the above-described difference, the light-emitting device package 100B illustrated in FIG. 4 is the same as the light-emitting device package 100A illustrated in FIGS. 2 and 3. Thus, the same components are designated by the same reference numerals, and a repeated description thereof is omitted.

Figure 5:
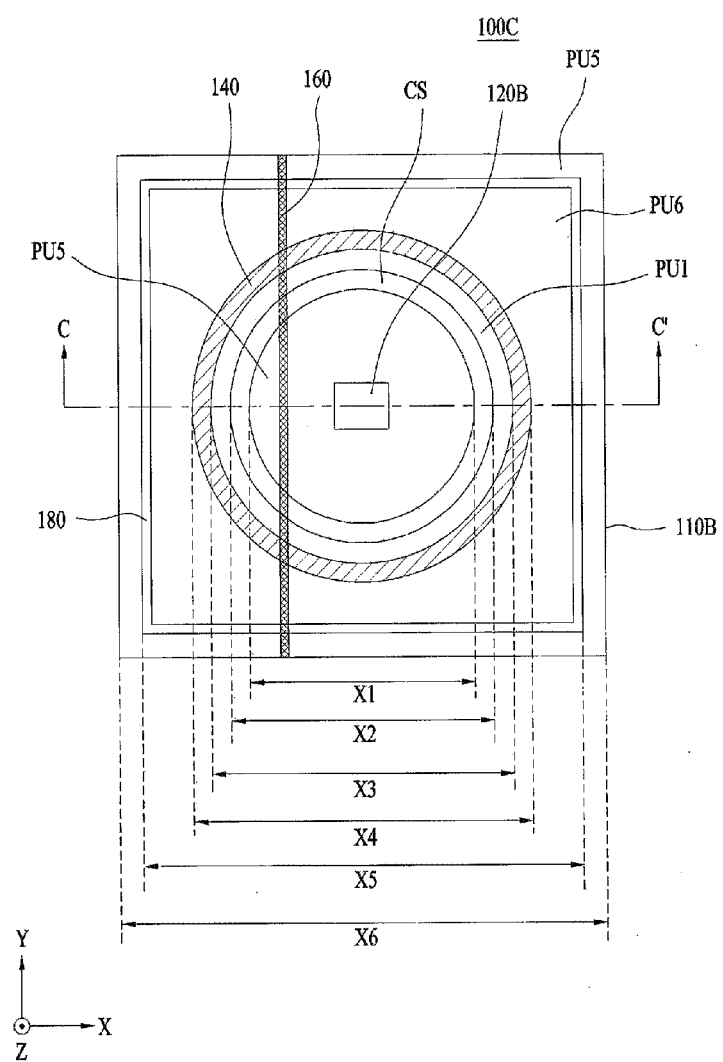
FIG. 5 is a plan view of a light-emitting device package according to another embodiment.
Figure 6:
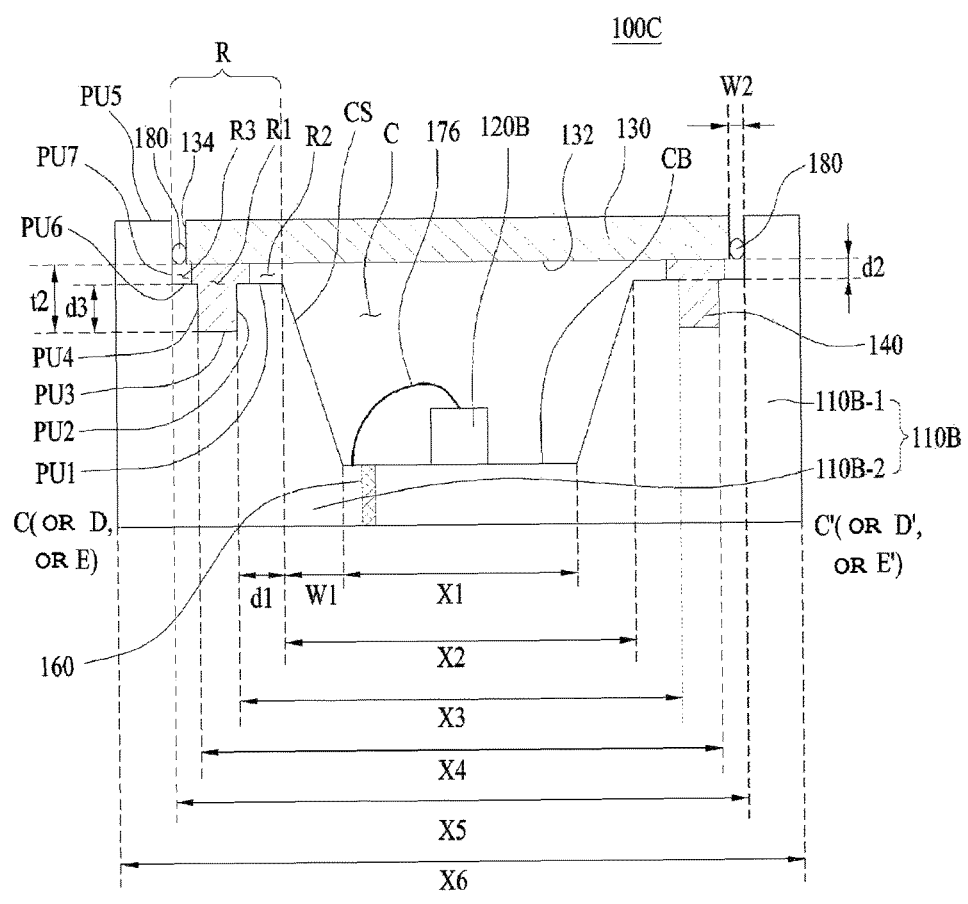
FIG. 6 is a sectional view taken along line C-C' of FIG. 5.

FIG. 5 is a plan view of a light-emitting device package 100C according to another embodiment, and FIG. 6 is a sectional view taken along line C-C' of FIG. 5. For convenience of description, in FIG. 5, the light-transmitting member 130 illustrated in FIG. 6 is omitted.

The recessed portion R of the light-emitting device package 100A illustrated in FIGS. 2 and 3 includes only the first and second recessed portions R1 and R2. On the other hand, the light-emitting device package 100C illustrated in FIGS. 5 and 6 may further include a third recessed portion R3, in addition to the first and second recessed portions R1 and R2.

The formation of the recessed portion R around the cavity C is the same as that of the light-emitting device package 100A illustrated in FIGS. 2 and 3. At this time, the recessed portion R is defined by the space that is enclosed by the first upper surface PU1, the first side surface PU2, the second upper surface PU3, the second side surface PU4, a third upper surface PU6, a third side surface PU7, and the lower surface 132 of the light-transmitting member 130. Here, the first upper surface PU1, the first side surface PU2, the second upper surface PU3, and the second side surface PU4 are the same as those described above in FIG. 3. The third upper surface PU6 corresponds to the upper surface of a package body 110B that extends from the second side surface PU4 in the direction (the X-axis direction) perpendicular to the thickness direction (the Z-axis direction). In addition, the third side surface PU7 corresponds to the side surface of the upper portion of the package body 110B that extends from the third upper surface PU6 in the thickness direction (the Z-axis direction) of the package body 110B.

In addition, the recessed portion R may include the first, second and third recessed portions R1, R2 and R3.

The first recessed portion (or the concave portion) R1 is defined in the same manner as the first recessed portion R1 described in FIG. 3. The third recessed portion R3 is defined by the space that is enclosed by the third upper surface PU6, the third side surface PU7, and the lower surface 132 of the light-transmitting member 130. The second recessed portion R2 is defined by the space in the recessed portion R excluding the first and third recessed portions R1 and R3.

As such, with the exception of the difference in the structure of the recessed portion R in the package body 110B, the package body 110B, a first body portion 110B-1 and a second body portion 110B-2 illustrated in FIGS. 5 and 6 are respectively the same as the package body 110A, the first body portion 110A-1 and the second body portion 110A-2 illustrated in FIGS. 2 and 3.

In addition, as illustrated in FIG. 6, when the light-transmitting member 130 is pushed in the thickness direction (the Z-axis direction) of the package body 110B, a portion of the bonding member 140 may be entirely accommodated in the concave portion R1, and a portion of the bonding member 140 may run over the concave portion R1 to a portion of the first upper surface PU1 and the third upper surface PU6 of the package body 110B. To this end, the first distance d1 and the volume of the concave portion R1 are determined as described above. That is, the bonding member 140 may be accommodated in the first recessed portion R1, but may also be located in a portion of the second and third recessed portions R2 and R3.

In addition, in the light-emitting device package 100A illustrated in FIGS. 2 and 3, the inner plan shape (i.e. the plan shape of the inner edge) of a fourth upper surface PU5 is a circular shape, and the outer plan shape (i.e. the plan shape of the outer edge) is a square shape. On the other hand, in the light-emitting device package 100C illustrated in FIGS. 5 and 6, both the inner and outer plan shapes of the fourth upper surface PU5 are a square shape. However, the embodiment is not limited thereto. That is, according to other embodiments, although not illustrated, the fourth upper surface PU5 may have circular (or elliptical) inner and outer plan shapes, may have a square inner plan shape and a circular (or elliptical) outer plan shape, or may have an elliptical inner plan shape and a square outer plan shape.

In addition, unlike the light-emitting device package 100A illustrated in FIGS. 2 and 3, which has different widths X1 to X5, the light-emitting device package 100C illustrated in FIGS. 5 and 6 has different widths X1 to X6 because the third recessed portion R3 is further provided.

In addition, the light-emitting device package 100A illustrated in FIG. 3 includes the molding member 150, whereas, in the light-emitting device package 100C illustrated in FIG. 6, the cavity C may be in a vacuum state, rather than being filled with the molding member 150. However, the embodiment is not limited thereto. That is, in the light-emitting device package 100A illustrated in FIG. 3, the cavity C may be in a vacuum state, and in the light-emitting device package 100C illustrated in FIG. 6, the cavity C may be filled with the molding member 150 as illustrated in FIG. 3.

In addition, in the same manner as in the light-emitting device 120A illustrated in FIGS. 2 and 3, a light-emitting device 120B illustrated in FIGS. 5 and 6 may have a horizontal, vertical or flip-bonding structure. For example, as illustrated in FIG. 6, the light-emitting device 120B may have a vertical bonding structure. In this case, the first electrode of the light-emitting device 120B may be directly electrically connected to the first body portion 110B-1, and the second electrode may be electrically connected to the second body portion 110B-2 via a wire 176.

With the exception of the difference described above, the light-emitting device package 100C illustrated in FIGS. 5 and 6 is the same as the light-emitting device package 100A illustrated in FIGS. 2 and 3. Thus, the same components are designated by the same reference numerals, and a repeated description thereof is omitted.

Figure 7:
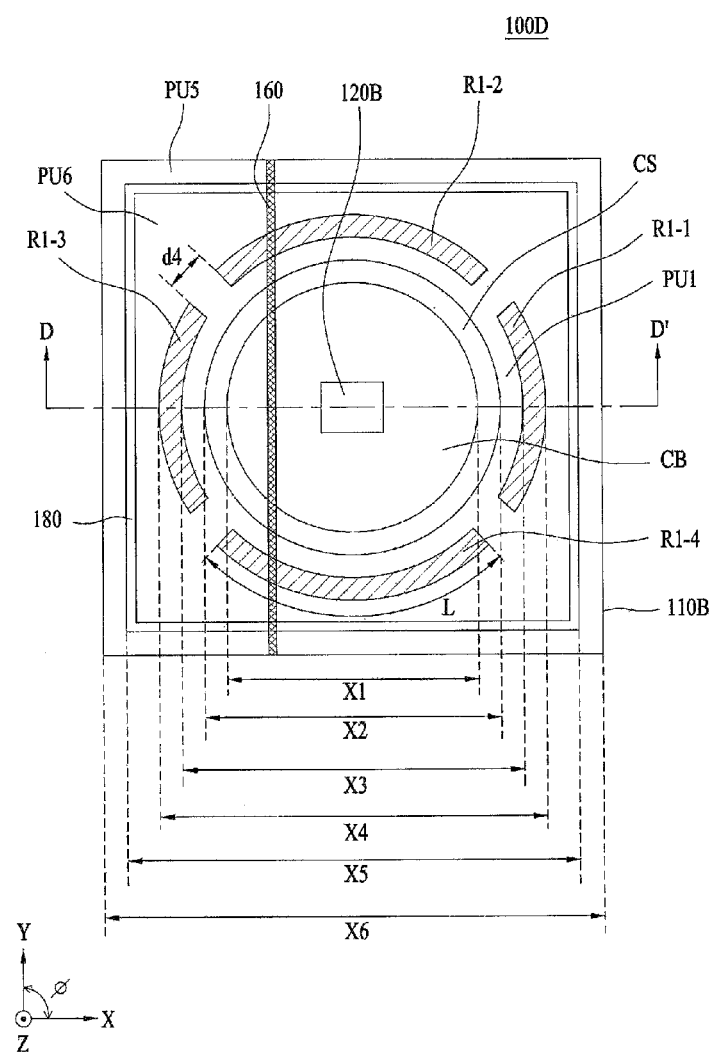
FIG. 7 is a plan view of a light-emitting device package according to another embodiment.

FIG. 7 is a plan view of a light-emitting device package 100D according to another embodiment. Here, for convenience of description, the illustration of the light-transmitting member 130 is omitted. However, the light-transmitting member 130 may be located as illustrated in FIG. 6.

The cross-sectional view of the light-emitting device package 100D taken along line D-D' of FIG. 7 is as illustrated in FIG. 6.

In the light-emitting device package 100C illustrated in FIG. 5, the first recessed portion R1 in which the bonding member 140 is accommodated has a closed-ring plan shape. On the other hand, referring to FIG. 7, the first recessed portion R1 may include the multiple first recessed portions R1-1, R1-2, R1-3 and R1-4, which are separated from one another. The first recessed portions R1-1, R1-2, R1-3 and R1-4 are spaced apart from one another by the fourth distance d4 in the direction (the Φ-axis direction) perpendicular to the thickness direction (the Z-axis direction) of the package body 110D. Here, the properties of the respective first recessed portions R1-1, R1-2, R1-3 and R1-4 are as described above in FIG. 4. That is, the respective first recessed portions R1-1, R1-2, R1-3 and R1-4 may be the same length L, or may be different lengths L.

When the fourth distance d4 between the first recessed portions R1-1, R1-2, R1-3 and R1-4 is greater than a half the length L, the space occupied by the first recessed portion R1 in which the bonding member 140 is accommodated may be narrow, and thus the bonding member 140 may run over the first recessed portion R1 to thereby move into the cavity C. In order to prevent this, for example, although the fourth distance d4 may be equal to or less than half the length of the respective first recessed portions R1-1, R1-2, R1-3 and R1-4, the embodiment is not limited thereto.

With the exception of the above-described difference, the light-emitting device package 100D illustrated in FIG. 7 is the same as the light-emitting device package 100C illustrated in FIGS. 5 and 6. Thus, the same components are designated by the same reference numerals, and a repeated description thereof is omitted.

Figure 8:
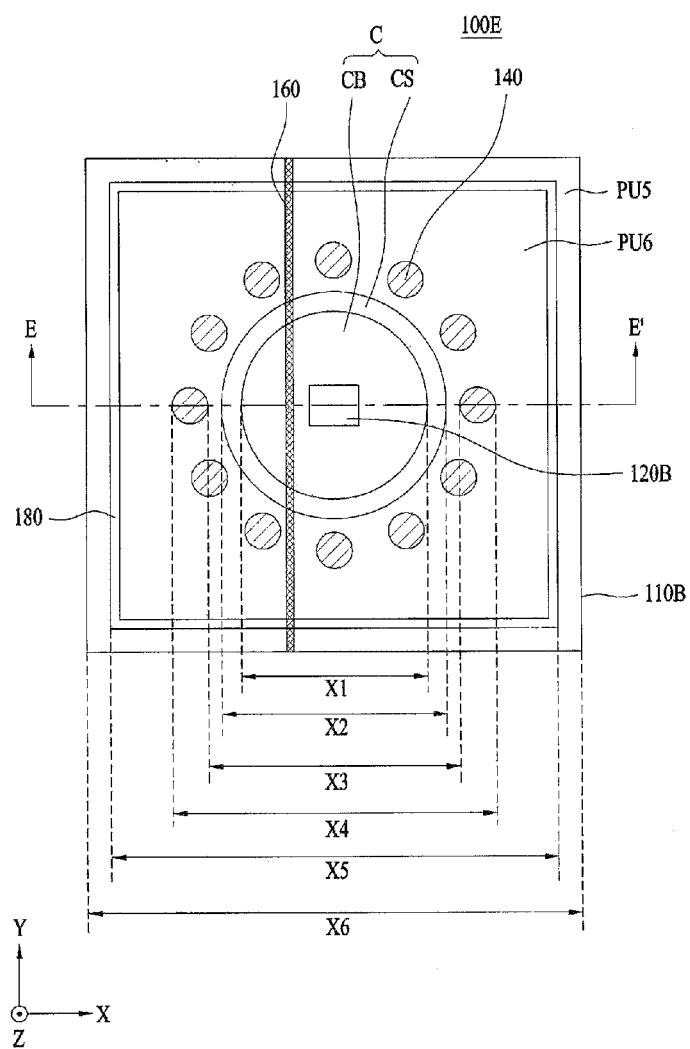
FIG. 8 is a plan view of a light-emitting device package according to a further embodiment.

FIG. 8 is a plan view of a light-emitting device package 100E according to a further embodiment. Here, for convenience of description, the illustration of the light-transmitting member 130 is omitted.

The cross-sectional view of the light-emitting device package 100E taken along line E-E' of FIG. 8 is as illustrated in FIG. 6.

In the light-emitting device package 100C illustrated in FIG. 5, the first recessed portion R1, in which the bonding member 140 is accommodated, has a closed-ring plan shape. On the other hand, referring to FIG. 8, the first recessed portion R1 has a dot plan shape. At this time, the accommodation of the bonding member 140 in the first recessed portion R1 having the dot plan shape is as described above. At this time, at least one of the number of dots, the distance between the dots, and the size of the dots may be set to achieve bonding between the light-transmitting member 130 and the package body 110B. For example, although the number of dots may be twelve as illustrated in FIG. 8, the embodiment may include dots that is greater or less than twelve.

With the exception of the above-described difference, the light-emitting device package 100E illustrated in FIG. 8 is the same as the light-emitting device package 100C illustrated in FIGS. 5 and 6. Thus, the same components are designated by the same reference numerals, and a repeated description thereof is omitted.

As described above, in the case of the light-emitting device packages 100A, 100B, 100C, 100D and 100E according to the embodiments, because the bonding member 140 is accommodated in the first recessed portion R1, when the light-transmitting member 130 is compressed in order to be bonded to the package body 110A or 110B, the bonding member 140 does not move into the cavity C. Accordingly, the above-described problems that may occur when the bonding member 140 is introduced into the cavity C may be solved, which results in enhanced luminous efficacy and an extended lifespan.

In addition, the contact area between the bonding member 140 and the light-transmitting member 130 may be increased, and the contact area between the bonding member 140 and the top of the package body 110A may be increased, which may maximize the strength of bonding between the light-transmitting member 130 and the package body 110A.

Meanwhile, each of the light-emitting device packages 100A, 100B, 100C, 100D and 100E according to the embodiments may further include a rubber ring 180 as illustrated in FIGS. 2 to 8.

The rubber ring 180 is located between a side surface 134 of the light-transmitting member 130 and the package body 110A or 110B.

For example, referring to FIG. 3, the rubber ring 180 is located between the side surface 134 of the light-transmitting member 130 and the second side surface PU4 of the package body 110A. In this case, the rubber ring 180 may be located in the space between the side surface 134 of the light-transmitting member 130 and the second side surface PU4 of the package body 110A above the bonding member 140.

In addition, referring to FIG. 6, the rubber ring 180 may be located between the side surface 134 of the light-transmitting member 130 and the third side surface PU7 of the package body 110B.

In addition, the rubber ring 180 may have a circular plan shape, an elliptical plan shape, or a polygonal plan shape. That is, the rubber ring 180 may have a circular plan shape as illustrated in each of FIGS. 2 and 4, or the rubber ring 180 may have a square plan shape as illustrated in each of FIGS. 5, 7 and 8.

In addition, referring to FIGS. 3 and 6, when the second width W2 of the rubber ring 180 is less than 0.1 mm, the space between the light-transmitting member 130 and the side surface PU4 or PU7 of the package body 110A or 110B may not be sealed, and thus the waterproofing, vapor-resistant or dust-proofing function may not be completely performed. When the second width W2 is greater than 0.15 mm, the separation distance between the side surface 134 of the light-transmitting member 130 and the side surface PU4 or PU7 of the package body 110A or 110B may be increased due to the presence of the rubber ring 180. Accordingly, although the second width W2 may range from 0.1 mm to 0.15 mm, the embodiment is not limited thereto.

The conventional light-emitting device package illustrated in FIG. 1 includes no member like the rubber ring 180 of the embodiments. Thus, as described above, gas molecules including moisture or water may be introduced into the cavity C under a high-temperature and high-humidity environment.

On the other hand, the light-emitting device packages 100A, 100B, 100C, 100D and 100E according to the embodiments include the rubber ring 180. Accordingly, when the light-emitting device packages 100A, 100B, 100C, 100D and 100E are operated under an environment of a high temperature within a range from 50° C. to 85° C. and a high relative humidity within a range from 80% RH to 95% RH (where, RH means Relative Humidity), the rubber ring 180 may prevent external water vapor, moisture, dust, or gas-type impurities from being introduced into the package C.

In addition, instead of the rubber ring 180, when a material such as silicon or epoxy is located between the side surface of the light-transmitting member 130 and the side surface PU4 or PU7 of the package body 110A or 110B and then is cured, the vapor-resistant or waterproofing function may not be completely performed. This is because the silicon or epoxy, which is not in the solid state before curing, may not seal the periphery of the side surface of the light-transmitting member 130. On the other hand, according to the embodiments, because the solid rubber ring 180 is used, the periphery of the side surface 134 of the light-transmitting member 130 may be completely sealed by mechanical rubber tension, whereby it is possible to reliably prevent, for example, gas molecules including moisture, or dust from being introduced into the cavity C. Accordingly, as the material of the rubber ring 180, the rubber may be replaced with a material that has a low penetration rate of liquid or gas in a solid state thereof.

A plurality of light-emitting device packages according to the embodiments may form an array on a board, and optical members, such as, for example, a light guide plate, a prism sheet, and a diffuser sheet, may be arranged on the optical path of the light-emitting device packages. The light-emitting device packages, the board, and the optical members may function as a light unit. According to a further embodiment, a display apparatus, an indicator apparatus, and a lighting system including the semiconductor light-emitting device or the light-emitting device packages disclosed in the above-described embodiments may be realized. For example, the lighting system may include a lamp or a street light.

Figure 9:
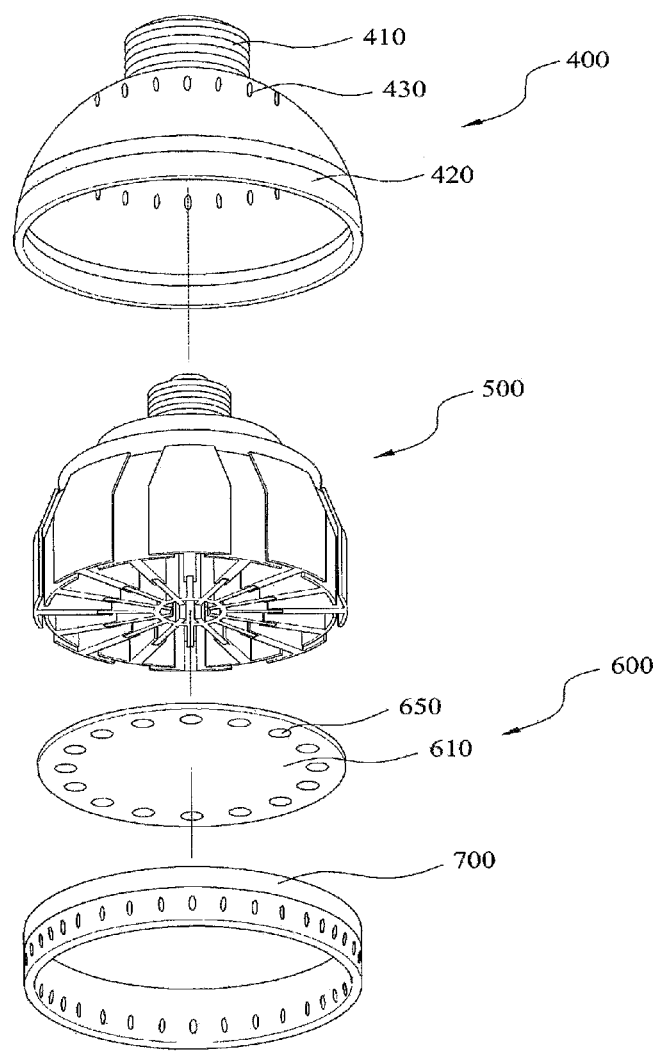
FIG. 9 is an exploded perspective view illustrating an embodiment of a lighting apparatus including the light-emitting device package according to the embodiments.

FIG. 9 is an exploded perspective view illustrating an embodiment of a lighting apparatus including the light-emitting device packages according to the embodiments.

The lighting apparatus according to the embodiment includes a light-emitting module 600 for projecting light, a housing 400 in which the light-emitting module 600 is accommodated, a radiator 500 for radiating heat from the light-emitting module 600, and a holder 700 for coupling the light-emitting module 600 and the radiator 500 to the housing 400.

The housing 400 includes a socket-coupling portion 410, which is coupled to an electric socket (not illustrated), and a body portion 420, which is connected to the socket-coupling portion 410 and accommodates the light-emitting module 600 therein. The body portion 420 may have one airflow through-hole 430 therein.

A plurality of airflow through-holes 430 may be formed in the body portion 420 of the housing 400. That is, one airflow through-hole 430 may be provided, a plurality of airflow through-holes 430 may be radially arranged as shown, or various other arrangements may be possible.

The light-emitting module 600 includes a plurality of light-emitting device packages 650 arranged on a circuit board 610. The light-emitting device packages 650 may include the light-emitting device packages 100A, 100B, 100C, 100D or 100E according to the above-described embodiments. The circuit board 610 may be shaped so as to be inserted into an opening in the housing 400, and may be formed of a highly thermally conductive material in order to transfer heat to the radiator 500 as will be described below.

The holder 700 may be provided below the light-emitting module, and may include a frame and another airflow through-hole. In addition, although not illustrated, an optical member may be provided below the light-emitting module 600 so as to diffuse, scatter or converge light projected from the light-emitting device module 650 of the light-emitting module 600.

Figure 10:
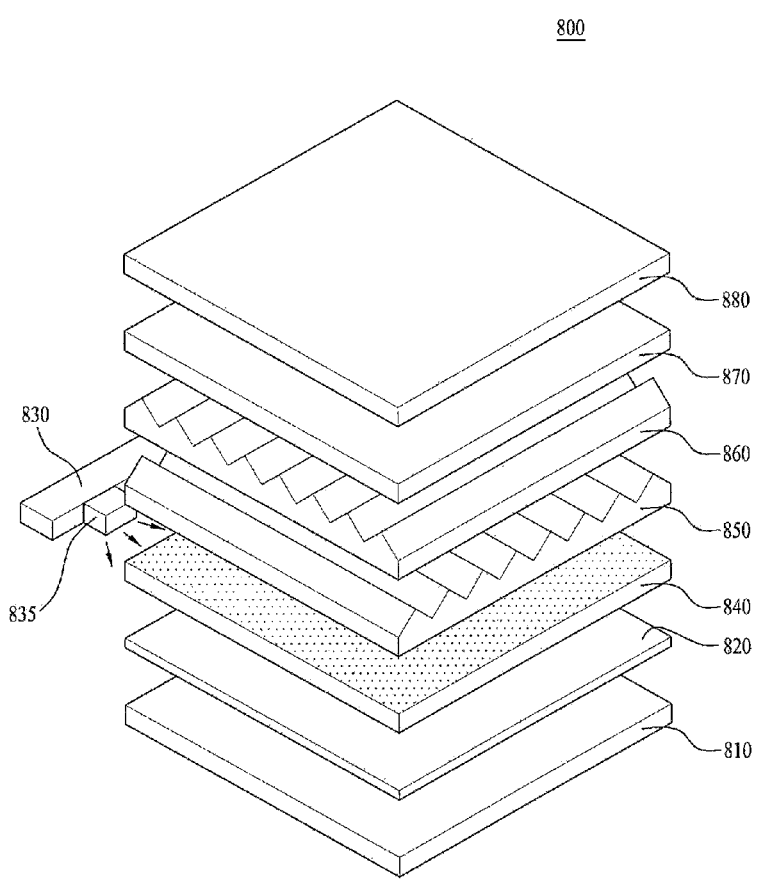
FIG. 10 is an exploded perspective view illustrating an embodiment of a display apparatus including the light-emitting device package according to the embodiments.

FIG. 10 is an exploded perspective view illustrating an embodiment of a display apparatus 800 including the light-emitting device packages according to the embodiments.

Referring to FIG. 10, the display apparatus 800 according to the embodiment includes a light-emitting module 830 and 835, a reflector 820 on a bottom cover 810, a light guide plate 840 located in front of the reflector 820 for guiding light emitted from the light-emitting module to the front side of the display apparatus, a first prism sheet 850 and a second prism sheet 860 located in front of the light guide plate 840, a panel 870 located in front of the second prism sheet 860, and a color filter 880 located in front of the panel 870.

The light-emitting module includes a light-emitting device package 835 described above, which is placed on a circuit board 830. Here, the circuit board 830 may be, for example, a Printed Circuit Board (PCB), and the light-emitting device package 835 may be the above-described light-emitting device package 100A, 100B, 100C, 100D or 100E.

The bottom cover 810 may accommodate constituent elements inside the display apparatus 800.

The reflector 820 may be provided as a separate element as illustrated in FIG. 8, or may be formed by coating the back surface of the light guide plate 840 or the front surface of the bottom cover 810 with a highly reflective material.

Here, the reflector 820 may be formed of a material that has high reflectance and may be used in an ultra thin form. The reflector 820 may be formed of polyethylene terephthalate (PET).

The light guide plate 840 scatters light emitted from the light-emitting device package module, thus causing the light to be uniformly distributed throughout the overall area of the screen of a liquid crystal display apparatus. Accordingly, the light guide plate 840 may be formed of a material that has a high index of refraction and a high transmittance. The light guide plate 840 may be formed of, for example, polymethylmethacrylate (PMMA), polycarbonate (PC) or polyethylene (PE). In addition, the light guide plate may be omitted and an air guide structure for transmitting light in the space above the reflective sheet 820 may be possible.

The first prism sheet 850 is formed on one surface of a support film using an elastic polymer material having light transmittance. The polymer material may include a prism layer in which a plurality of stereoscopic structures is repeatedly formed. Here, the multiple patterns, as illustrated, may be arranged in stripes in which valleys and ridges are repeated.

The direction in which ridges and valleys are formed on one surface of a support film in the second prism sheet 860 may be perpendicular to the direction in which the ridges and valleys are formed on one surface of the support film in the first prism sheet 850. This serves to uniformly distribute the light transmitted from the light-emitting module and the reflective sheet to the panel 870 in all directions.

In the embodiment, the first prism sheet 850 and the second prism sheet 860 form an optical sheet. The optical sheet may be any of different combinations, for example, a micro-lens array, a combination of a diffuser sheet and a micro-lens array, or a combination of a single prism sheet and a micro-lens array.

The panel 870 may include a liquid crystal display panel, or a different kind of display apparatus requiring a light source except for the liquid crystal display panel 870.

The panel 870 is configured such that liquid crystals are located between glass bodies, and in order to use the deflection of light, a polarizer is disposed on both the glass bodies. Here, the properties of the liquid crystals are intermediate to those of a liquid and a solid, and the liquid crystals, which are organic molecules having fluidity like liquid, are regularly arranged like crystals, and display an image using the arrangement of molecules, which is changed by an external electric field.

The liquid crystal display panel used in the display apparatus is of an active-matrix type, and uses a transistor as a switch that adjusts the voltage to be supplied to each pixel.

The color filter 880 may be provided on the front surface of the panel 870, and may show an image from the light that has passed through the panel 870 because respective pixels transmit only red, green and blue light.

In conclusion, in the related art, a bonding member, which bonds a light-transmitting member and a package body to each other, may be introduced into the slope of a cavity, thereby preventing reflection of light by the slope of the cavity, and when the bonding member introduced into the cavity may is discolored, the lifespan of a light-emitting device package may be reduced. However, a light-emitting device package according to the above-described embodiments may solve the above problems in the related art because the bonding member is accommodated in a concave portion around the cavity. Thus, the light-emitting device package according to the above-described embodiments may achieve enhanced luminous efficacy and an extended lifespan. In addition, the light-emitting device package according to the above-described embodiments may increase bonding force as the bonding member bonds the package body and the light-transmitting member to each other over more increased area, and may have excellent waterproofing, vapor-resistant, and dustproofing functions because it may prevent, for example, external moisture, water or dust from being introduced into the cavity by mechanically fitting a rubber ring between the side surface of the light-transmitting member and the package body.

Although the exemplary embodiments have been illustrated and described as above, it will of course be apparent to those skilled in the art that the embodiments are provided to assist understanding and the embodiments are not limited to the above description, and various modifications and variations can be made in the embodiments without departing from the spirit or scope of the disclosure, and the modifications and variations should not be understood individually from the viewpoint or scope of the disclosure so long as they include the constituent elements set forth in the claims.

MODE FOR INVENTION

Embodiments for implementation of this disclosure have sufficiently described in the above "Best Mode".

INDUSTRIAL APPLICABILITY

A light-emitting device package according to the above-described embodiments may be applied to various fields, such as, for example, a display apparatus, an indicator apparatus, or a lighting system such as a lamp or a street lamp.

The invention claimed is:

1. A light-emitting device package, comprising:
a package body including a flat top surface, a first bottom surface, a cavity recessed from the flat top surface toward the bottom surface, and a plurality of recesses recessed from the top surface toward the first bottom surface;
a light emitting device disposed in the cavity;
a bonding member disposed on the plurality of recesses; and
a glass member including a second bottom surface facing the light emitting device, and disposed on the bonding member,
wherein the plurality of recesses having circular shaped are spaced apart from each other by a predetermined distance in a lateral direction,
wherein the predetermined distance between the plurality of recesses is equal to or less than a half a length of each of the plurality of recesses,
wherein the bonding member extends toward a portion of the flat top surface of the package body disposed between the plurality of the recesses and the cavity,
wherein an end portion of the bonding member adjacent to the cavity is spaced apart from the cavity in a prescribed distance on the portion of the flat top surface of the package body in the lateral direction,
wherein the glass member includes a top surface opposite to the second bottom surface, and a first side surface disposed between the second bottom surface and the top surface.
wherein the bonding member not contacts the first side surface of the glass member, and
wherein the bonding member directly contacts the second bottom surface of the glass member and the flat top surface of the package body.

2. The package according to claim 1, wherein the light emitting device emits an ultraviolet light.
wherein the ultraviolet light emitted from the light emitting device has a main wavelength within a range from 200 nm to 300 nm, and
wherein the glass member is configured to transmit the ultraviolet light.

3. The package according to claim 1, wherein the plurality of recesses and the cavity are spaced apart from each other in the lateral direction,
wherein the plurality of recesses are arranged in a circular manner around the cavity, and
wherein each of the recesses includes a third bottom surface and a second side surface.

4. The package according to claim 1, wherein the bonding member includes an UV bond, acryl, urethane, silicon, or epoxy.

5. The package according to claim 1, wherein the cavity is not filled with a molding member.

6. The package according to claim 1, wherein a first depth of the cavity is greater than a second depth of each of the recesses.

7. The package according to claim 1, wherein the light-emitting device comprises a light-emitting diode having a flip-bonding type.

8. The package according to claim 1, wherein the package body includes a reflective layer that is disposed on a surface of the package body.

9. The package according to claim 1, wherein the package body is formed of a metal.

10. The package according to claim 3, wherein the first side surface of the glass member is parallel to the second side surface of each of the recesses.

11. The package according to claim 1, wherein the package body includes a third side surface facing the first side surface of the glass member.

12. The package according to claim 11, wherein the third side surface of the package body is parallel to the first side surface of the glass member.

13. The package according to claim 11, further comprising a ring disposed between the third side surface of the package body and the first side surface of the glass member.

* * * * *